United States Patent [19]
Yoshino et al.

[11] Patent Number: 5,254,819
[45] Date of Patent: Oct. 19, 1993

[54] HIGH-FREQUENCY HEATING APPARATUS WITH COPPER FOR GROUNDING LAYER SURROUNDING ELECTROMAGNETIC WAVE ANTENNA

[75] Inventors: Koji Yoshino, Kyoto; Takashi Kashimoto, Nara; Kimiaki Yamaguchi, Nara; Masato Youta, Nara; Shinichi Sakai, Yamatokoriyama; Satomi Moriyama, Nara, all of Japan

[73] Assignee: Matsushita Electric Industrial Co., Ltd., Kadoma, Japan

[21] Appl. No.: 752,459
[22] PCT Filed: Dec. 29, 1989
[86] PCT No.: PCT/JP90/01703
    § 371 Date: Aug. 28, 1991
    § 102(e) Date: Aug. 28, 1991
[87] PCT Pub. No.: WO91/10338
    PCT Pub. Date: Jul. 11, 1991

[30] Foreign Application Priority Data

Dec. 29, 1989 [JP] Japan .................. 1-340648
Feb. 28, 1990 [JP] Japan .................. 2-47567
Jul. 17, 1990 [JP] Japan .................. 2-188941

[51] Int. Cl.⁵ .............................. H05B 6/68
[52] U.S. Cl. ................. 219/10.55 B; 219/10.55 E
[58] Field of Search ............. 219/10.55 B, 10.55 R, 219/10.55 F, 10.55 E; 343/700 MS File, 878

[56] References Cited

U.S. PATENT DOCUMENTS

| | | | |
|---|---|---|---|
| 3,778,717 | 12/1973 | Okoshi et al. | 343/772 |
| 4,211,911 | 7/1980 | Dehn | 219/10.55 F |
| 4,341,937 | 7/1982 | Staats | 219/10.55 B |
| 4,520,250 | 5/1985 | Ishihara et al. | 219/10.55 B |
| 4,853,703 | 8/1989 | Murakami et al. | 343/700 MS |

FOREIGN PATENT DOCUMENTS

| | | |
|---|---|---|
| 0467224 | 1/1992 | European Pat. Off. |
| 52-86545 | 7/1977 | Japan |
| 57-128057 | 8/1982 | Japan |
| 1-304688 | 12/1989 | Japan |

*Primary Examiner*—Philip H. Leung
*Attorney, Agent, or Firm*—Wenderoth, Lind & Ponack

[57] ABSTRACT

An antenna (6) for sensing a portion of electromagnetic waves irradiated into a heating chamber by a wave irradiator (3) and a detection circuit for performing detection of electric power from the output of the antenna are provided on the same printed board (11), while operation of devices is controlled by a controller (8) on the basis of an output of the detection circuit such that an optimum finished state of cooking is obtained.

8 Claims, 9 Drawing Sheets

FIG. I
(PRIOR ART)
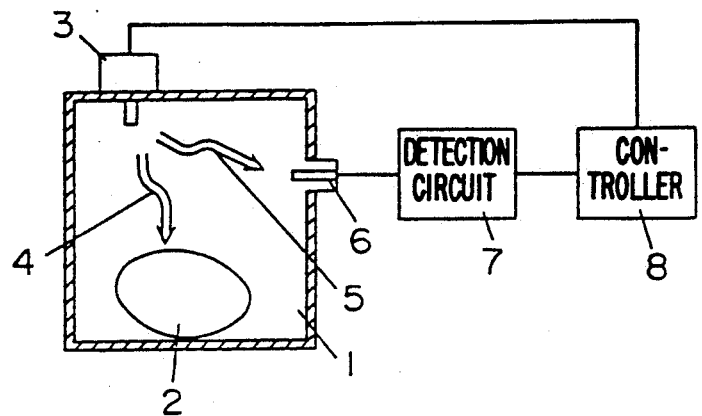
FIG. 2
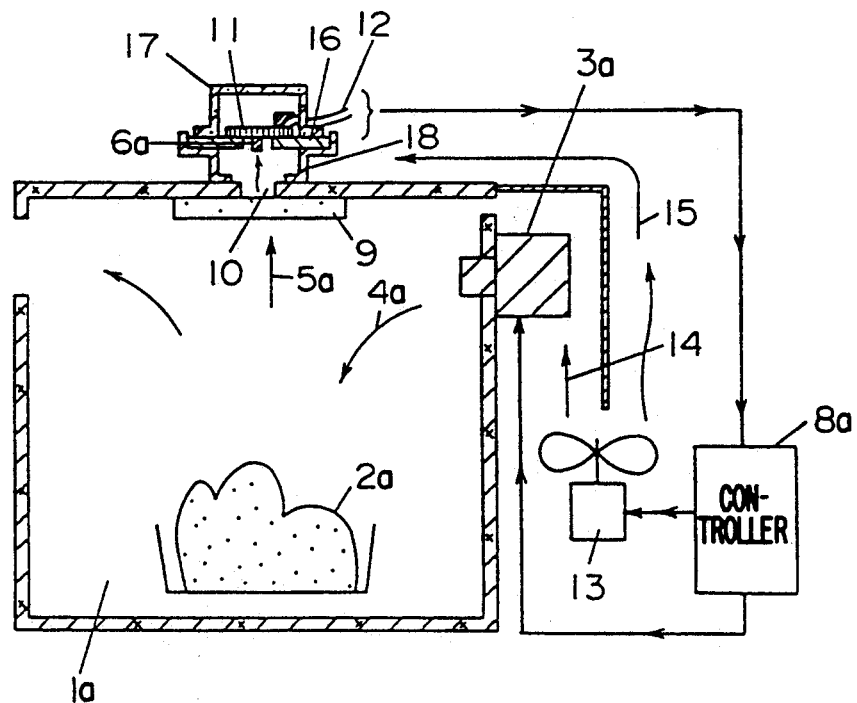

HIGH-FREQUENCY HEATING APPARATUS WITH COPPER FOR GROUNDING LAYER SURROUNDING ELECTROMAGNETIC WAVE ANTENNA

TECHNICAL FIELD

The present invention relates to a high-frequency heating apparatus in which the condition of a food is estimated by detecting the state of electromagnetic waves in a heating chamber such that operation of devices is controlled.

BACKGROUND OF THE INVENTION

In recent years, a trend that thawing of foods by the use of high-frequency heating apparatuses is automated has become predominant. Conventionally, a procedure has been followed in which the weight of a food is inputted by keys to control automatic timing or the weight is measured by using a weight sensor for automatically detecting the weight of the food such that the food is heated for a corresponding one of optimum heating periods preset for different weights of foods, respectively.

Furthermore, Japanese Patent Publication No. 52-2133 proposes that a microwave detecting element, namely, an antenna be disposed in a heating chamber so as to utilize a characteristic that the electric power of microwaves detected by the microwave detecting element which have not been absorbed by a food is inversely proportional to the weight of the food. Hereinbelow, this arrangement is described with reference to FIG. 1. A frozen food 2 is placed in a heating chamber 1 and waves 4 are irradiated over the food 2 from a wave irradiator 3. At this time, a portion 5 of the waves, which has not been absorbed by the food 2, is sensed by an antenna 6 mounted in the heating chamber 1 and then is subjected to detection by a detection circuit 7 so as to be delivered to a controller 8. Since the quantity of the waves sensed by the antenna 6 is inversely proportional to the amount absorbed by the food 2, the weight of the food 2 can be judged and thus, its optimum heating period can be set.

However, in the known high-frequency heating apparatus referred to above, in the case where state of waves in the heating chamber is sensed by using the antenna and the detection circuit in order to detect state of the food in the heating chamber, the detection level changes greatly depending on the construction of the antenna, construction of the detection circuit, mounting accuracy of the antenna and the detection circuit, influence of any external magnetic field, etc. Thus, a problem arises that this constitutes an extremely unstable factor for determination of subsequent sequences requiring estimation of the weight of the food, etc.

DISCLOSURE OF THE INVENTION

The present invention eliminates such conventional drawbacks and has for its object to provide an optimum finished state of cooking in which control of operating devices based on detection of the state of electromagnetic waves by the use of an antenna and a detection circuit is performed remarkably stably.

In order to accomplish this object, a high-frequency heating apparatus according to the present invention comprises: a heating chamber for accommodating a food; a wave irradiator for irradiating microwaves so as to heat the food; an antenna for sensing state of the microwaves in the heating chamber; a detection circuit for performing detection of the microwaves detected by the antenna; and a controller for controlling operation of various operating devices in accordance with an output of the detection circuit; wherein the detection circuit is formed on a double-sided board having copper foil applied to opposite faces of the board material.

The antenna can likewise be formed by copper foil on a printed board.

Furthermore, the antenna and the detection circuit can be formed on the same board.

BRIEF DESCRIPTION OF THE DRAWINGS

FIG. 1 is a schematic view showing an arrangement of a prior art high-frequency heating apparatus provided with an antenna;

FIG. 2 is a schematic view showing an arrangement of a high-frequency heating apparatus according to one embodiment of the present invention;

BEST MODE FOR WORKING THE INVENTION

Figure 3:
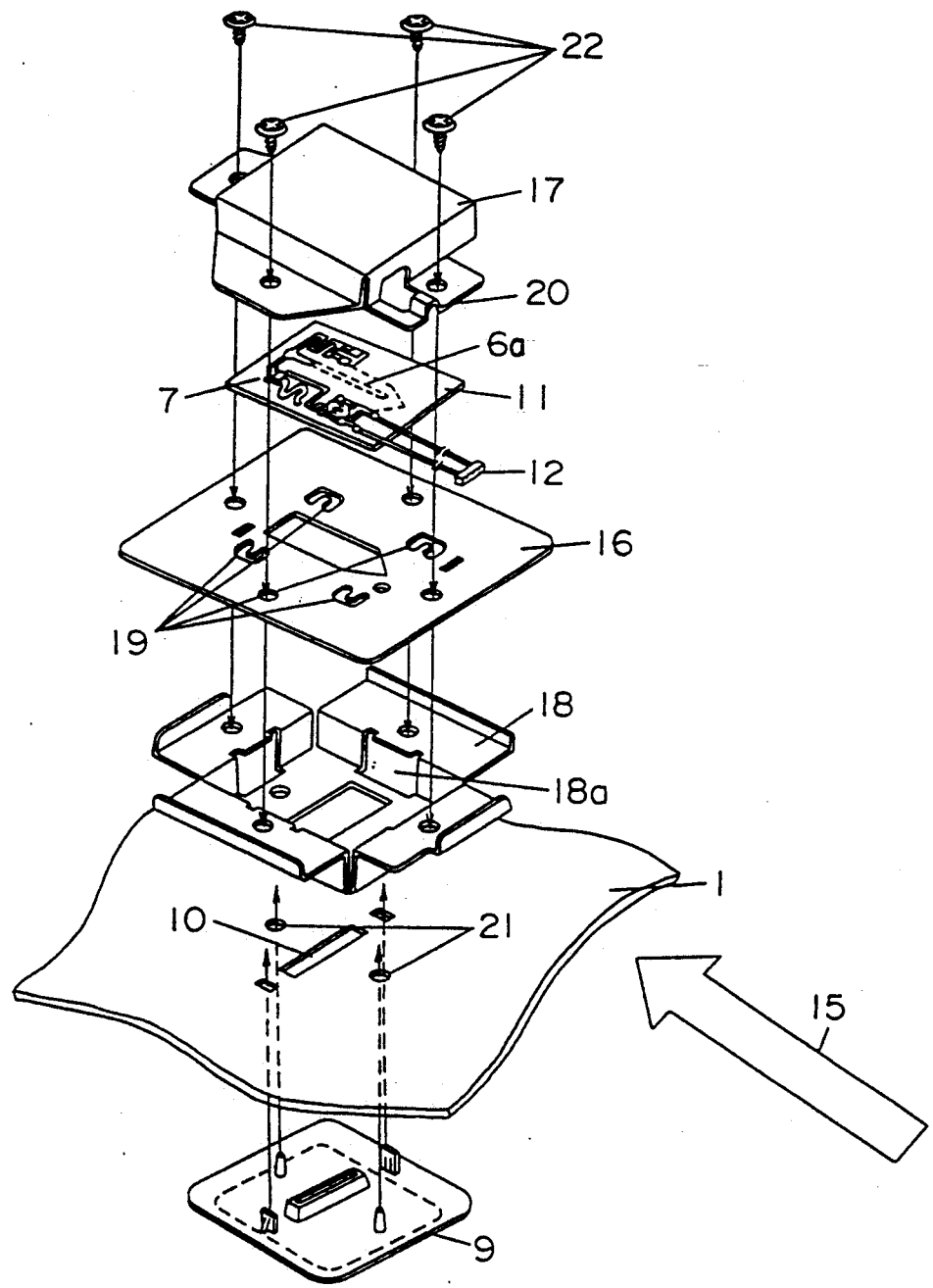
FIG. 3 is an exploded perspective view showing an arrangement of a main portion of the high-frequency heating apparatus of the present invention.

FIG. 2 is a view partly in section showing an arrangement of a high-frequency heating apparatus according to one embodiment of the present invention. Microwaves 4a are irradiated over a food 2a placed in a heating chamber 1a from a wave irradiator 3a. At this time, a portion 5a of the microwaves, which includes reflected waves, penetrates through a resinous slit cover 9 in accordance with condition of the food 2a so as to pass through a slit 10 formed in a wall of the heating chamber 1a and is sensed by an antenna 6a which is formed by copper foil provided on one face of a printed board 11. The portion 5a of the waves is transmitted to a detection circuit 7a provided on the other face of the printed board 11 so as to be subjected to detection and then, is delivered, as a detection circuit output, to a controller 8a by a lead wire 12. In accordance with amount of microwaves detected, the controller 8a determines the state of the food 2 and judges an optimum thawing period so as to control operation of the wave irradiator 3a and a fan 13. A large portion 14 of cool air from the fan 13 is directed to the wave irradiator 3a, while a portion 15 of the cool air is guided to the printed board 11 having the antenna 6a and the detection circuit 7a.

The printed board 11 is formed as a double-sided board in which copper foil is applied to opposite faces of a board made of ethylene tetrafluoride resin or glass epoxy resin. One face of the printed board 11 acts as a signalling face so as to form the detection circuit 7a, while the other face of the printed board 11 acts as a grounding face such that a strip circuit is formed between the signalling face and the grounding face. The antenna 6a is formed on the grounding face and the printed board 11 is soldered to a metal plate 16 by using the grounding face. A metal cover 17 for protecting the detection circuit 7 from external noise is mounted by using the metal plate 16. The lead wire 12 is gripped between the metal plate 16 and the metal cover 17 so as to be fixed in position such that an integral structure is formed. Furthermore, by using machine screws, the metal plate 16 and the metal cover 17 are fastened together to a metal support 18 spot welded to the wall of the heating chamber 1a. As shown in FIG. 3, the support 18 has ventilation openings 18a for passing therethrough the portion 15 of wind from the fan 13.

FIG. 3 is a fragmentary perspective view showing one example of a mounting arrangement on the wall of the heating chamber 1. The grounding face of the printed board 11 having the antenna 6a and the detection circuit 7a provided on its opposite faces, respectively is soldered to four convex portions 19 of the metal plate 16. The printed board 11 is covered from above by the metal cover 17 for intercepting microwaves. Then, while the lead wire 12 is being gripped between a lead wire clamp 20 of the metal cover 17 and the metal plate 16 so as to be fixed, the metal plate 16 and the metal cover 17 are fastened together to the metal support 18 with machine screws 22 during positioning on the wall of the heating chamber 1a by the use of positioning holes 21. In this arrangement, a ground of the printed board 11, namely a ground of the detection circuit 7a can be positively obtained by soldering the printed board 11 to the metal plate 16. Meanwhile, the metal plate 16 and the metal support 18 are securely short-circuited by fastening of the machine screws 22, while the metal support 18 and the wall of the heating chamber 1a are reliably short-circuited by welding. Therefore, mounting accuracy is excellent for microwave and grounding is reliable. Since stress caused by fastening of the machine screws is absorbed by the metal plate 16, stress on the detection circuit 7a can be restricted.

Figure 4:
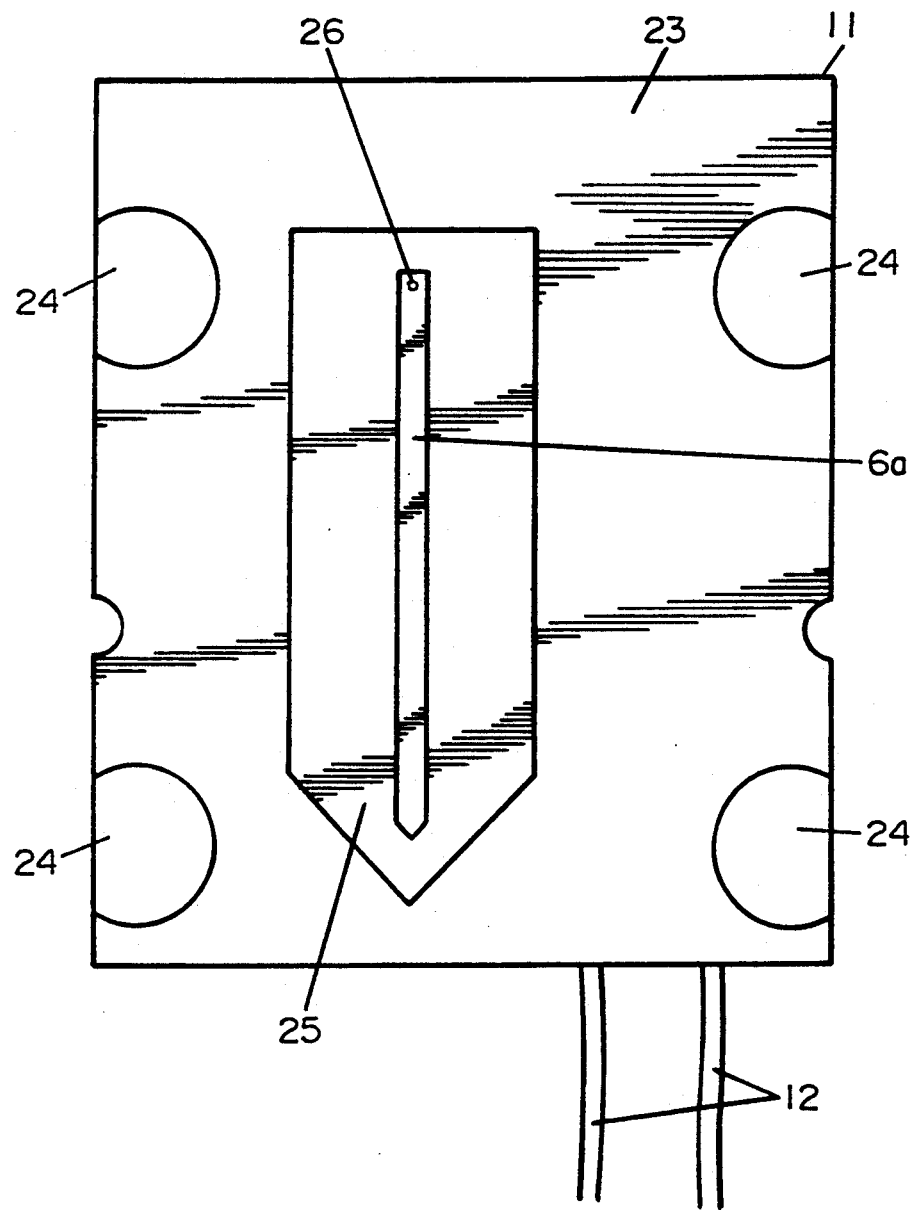
FIG. 4 is a plan view showing an arrangement of one embodiment of an antenna.

FIG. 4 shows the printed board 11 as observed from the side of the antenna 6a. On the antenna 6a and the grounding layer 23, resist coating is formed on the surface of the copper foil. On the other hand, a soldering face 24 is electrically short-circuited to the grounding face 23 but does not have the resist coating so it can be easily soldered to the metal plate 16. Meanwhile, an area 25 around the periphery of the antenna has neither the copper foil nor the coating and thus, material of the board is exposed. Microwaves sensed by the antenna 6a are adapted to be delivered to the detection circuit 7a on the rear face via a through-hole 26. The coating is used for stabilizing detection performance through protection of the surface of the copper foil.

Figure 5:
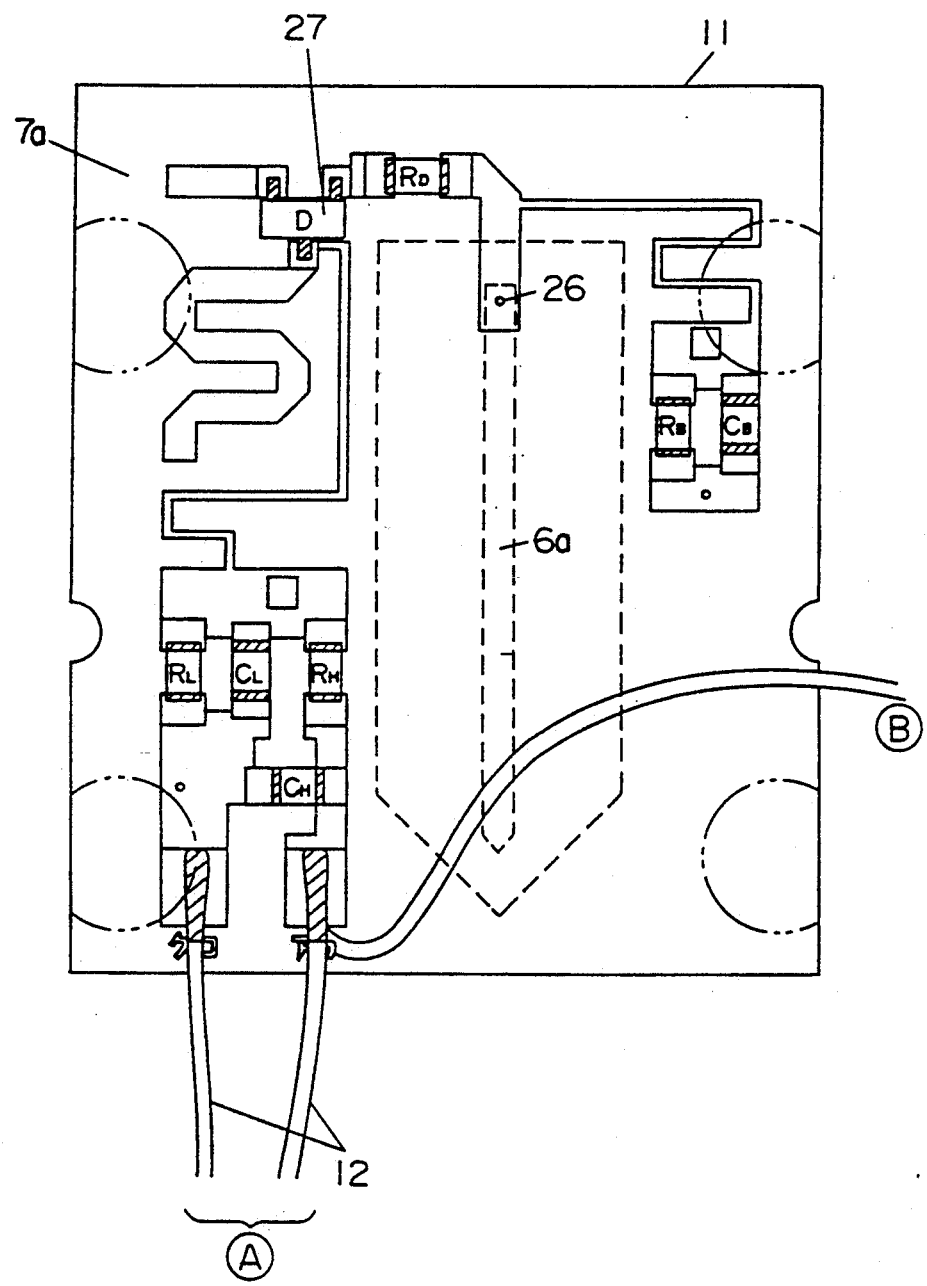
FIG. 5 is a plan view showing an arrangement of one embodiment of a detection circuit.

FIG. 5 shows the printed board 11 as observed from the side of the detection circuit 7a. In FIG. 5, broken lines and one-dot chain lines indicate the arrangement on the side of the antenna 6a as shown in FIG. 4. Microwaves delivered from the antenna 6 are guided to the detection circuit 7a via the throughhole 26 and subjected to detection by the detection circuit 7a which is constituted by a microstrip line employing chip parts such as a diode 27 and the copper foil. The value of the detected microwaves is supplied to the lead wire 12 as a direct current. In accordance with the present invention, the lead wire 12 is fixed at a location A of FIG. 5 through guide of a lead wire clamp 20 on the metal cover 17. However, if the lead wire 12 is not clamped as in prior art, the lead wire 12 may be positioned at a location B. Since the lead wire 12 made of metal comes close to the antenna 6a through the board acting as, so to speak, an intermediary, a phenomena may happen that impedance obtained at the time when the antenna 6a is conducting waves from the interior of the heating chamber 1 changes greatly and electromagnetic waves are carried by the lead wire 12 itself. Therefore, if the lead wire 12 is fixed in position without being free, remarkable stabilization can be effected.

Figure 6:
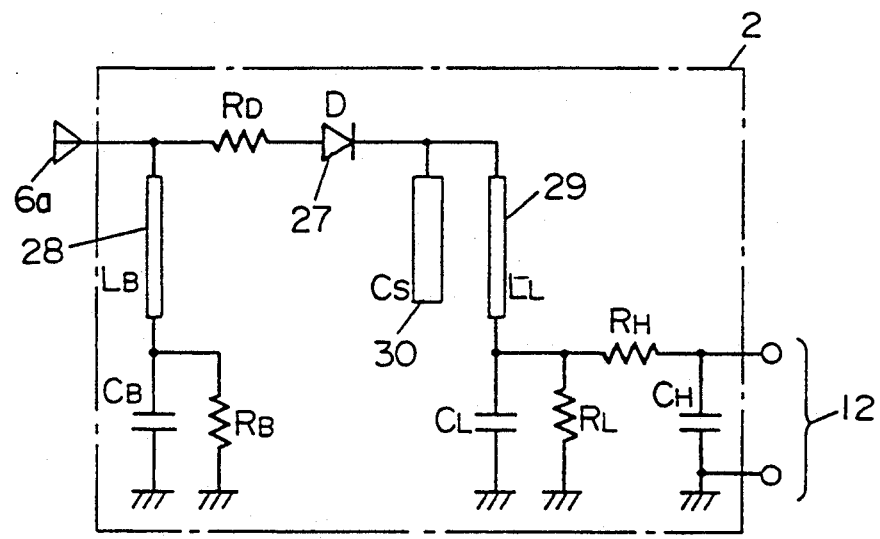
FIG. 6 is a circuit diagram showing an equivalent circuit of the detection circuit.

FIG. 6 is an equivalent circuit showing one example of the detection circuit 7. Electric power obtained from the antenna 6a is subjected to detection by the diode 27, integrated and filtered by a low-pass filter so as to be delivered, as a detection output, to leads 12 to the controller 8a. In the case where the detection circuit 7a is formed on the double sided board, inductances 28 and 29 for the low-pass filter and a capacitance 30 for integration can be constituted by a microstrip line.

Figure 7:
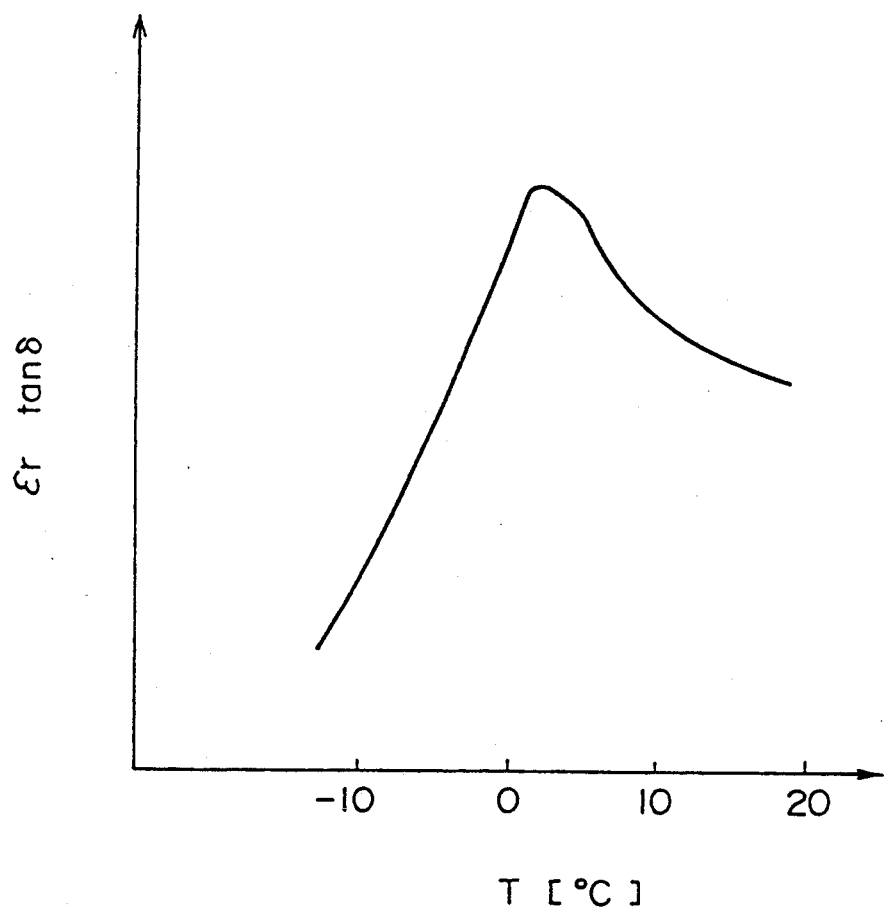
FIG. 7 is a graph showing temperature of a food and degree of absorption of microwaves.
Figure 8:
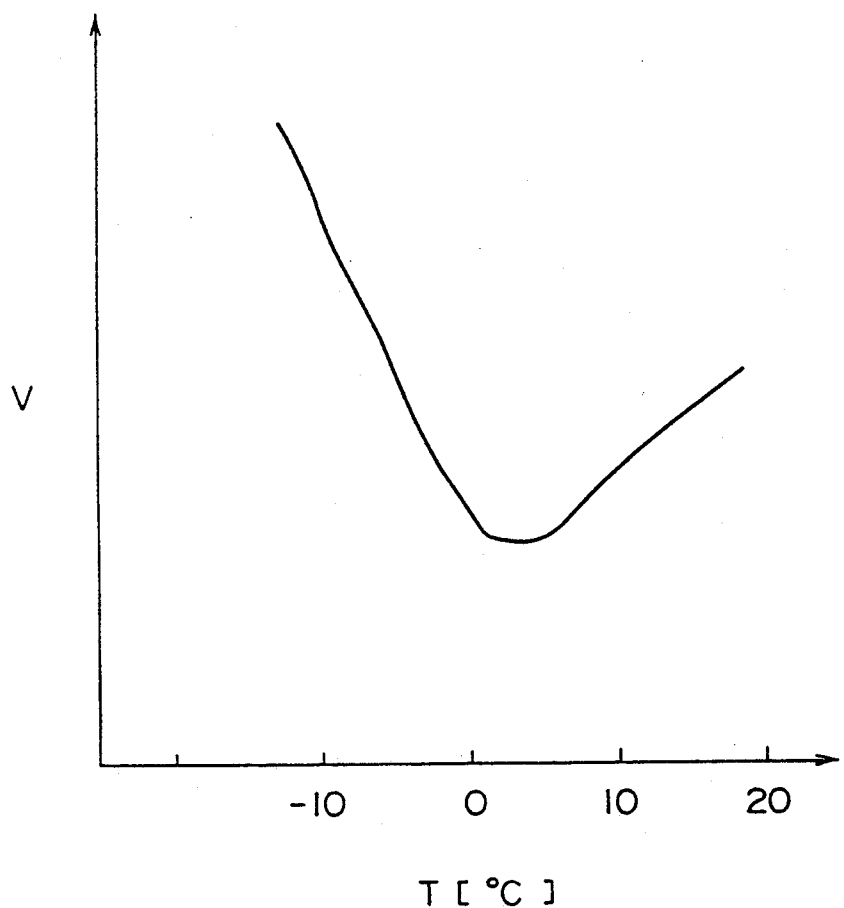
FIG. 8 is a graph showing the optimum relation between the temperature of a food and output of the detection circuit.
Figure 9:
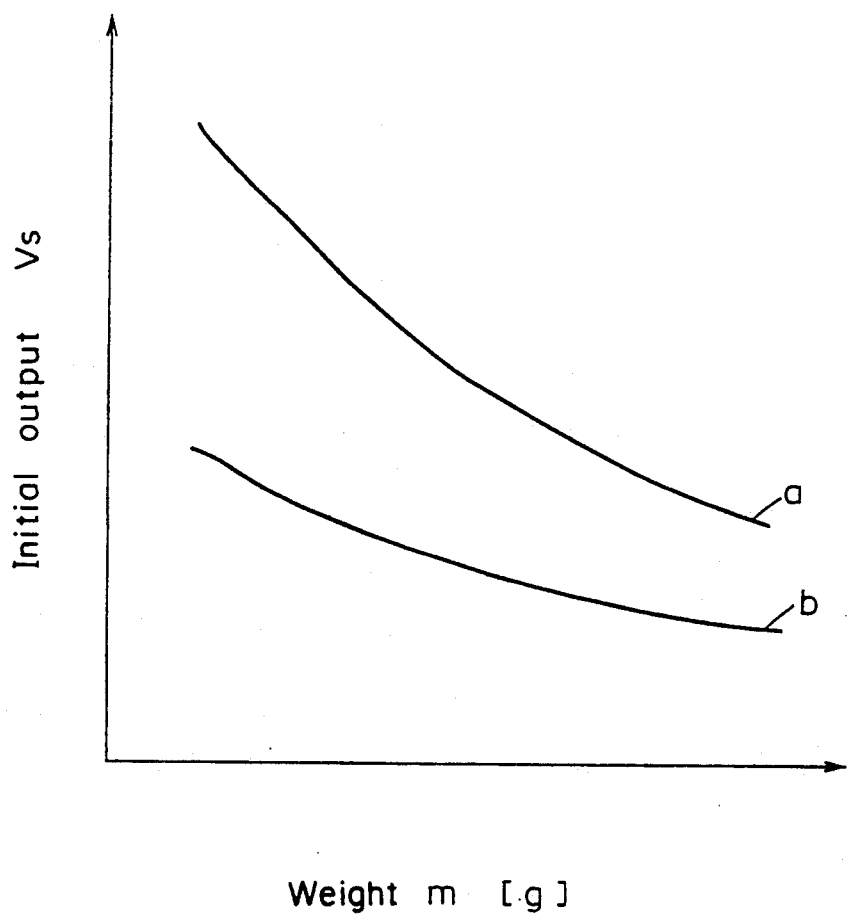
FIG. 9 is a graph showing the optimum relation between the weight of a food and output of the detection circuit.

FIGS. 7 to 9 are graphs showing characteristic curves indicative of a detection principle for thawing in the high-frequency heating apparatus of the present invention. The detection principle is described here. When a food is uniformly heated such that the temperature of the whole of the food rises simultaneously, the product of specific inductive capacity $\epsilon_r$, and dielectric loss $\tan\delta$ changes as shown in FIG. 7. In FIG. 7, the abscissa indicates temperature of the food, while the ordinate indicates ($\epsilon_r\tan\delta$). ($\epsilon_r\tan\delta$) is an index for indicating how readily the food absorbs microwaves and shows that the food is less likely to absorb microwaves in a frozen state of the food but is likely to absorb microwaves in the vicinity of 0° C. In other words, the amount of microwaves sensed by the antenna which have not been absorbed by the food is large when the state of the food is the frozen state but becomes small in the vicinity of 0° C. FIG. 8 shows this. In FIG. 8, the abscissa indicates temperature of the food, while the ordinate indicates output of the detection circuit. As will be seen from FIG. 8, when the food exhibits uniform rise of temperature, it is possible to detect thawing at a point of inflection (minimum value) of the detection output. However, actually, heating by the high-frequency heating apparatus is nonuniform and produces a combination of locations where microwaves are concentrated and locations where microwaves are not concentrated. Thus, since a characteristic in which a number of curves like that of FIG. 8 overlap each other is obtained, it is impossible to simply judge completion of thawing at the point of inflection.

Hence, an initial value and an initial change rate of output of the detection circuit are actually effective for detecting thawing. The initial value is approximately inversely proportional to the weight of the food. For example, in the case where the amount of food is small, absorption of microwaves is small and thus, initial output of the detection circuit is large. On the other hand, in the case where the amount of food is large, absorption of microwaves is large and thus, initial output of the detection circuit is small. Meanwhile, in the case of food of low temperature of, for example, −20° C. and food of intermediate temperature of, for example, −10°

C., there is a trend in which the initial change rate of output of the detection circuit is large and small, respectively.

From the above principle, a relation between weight of the food and initial output is obtained as shown in FIG. 9 by using the initial change rate as a parameter such that weight and initial temperature of the food can be judged. In FIG. 9, the curve a is for food of low temperature having a large initial change rate, while the curve b is for food of intermediate temperature having a small initial change rate. Needless to say, by cooking through setting of an optimum heating period for each weight and each initial temperature in the controller 8a, remarkably stable detection of thawing is achieved, in comparison with a weight sensor which may make erroneous decisions due to the weight of a dish.

Figure 10:
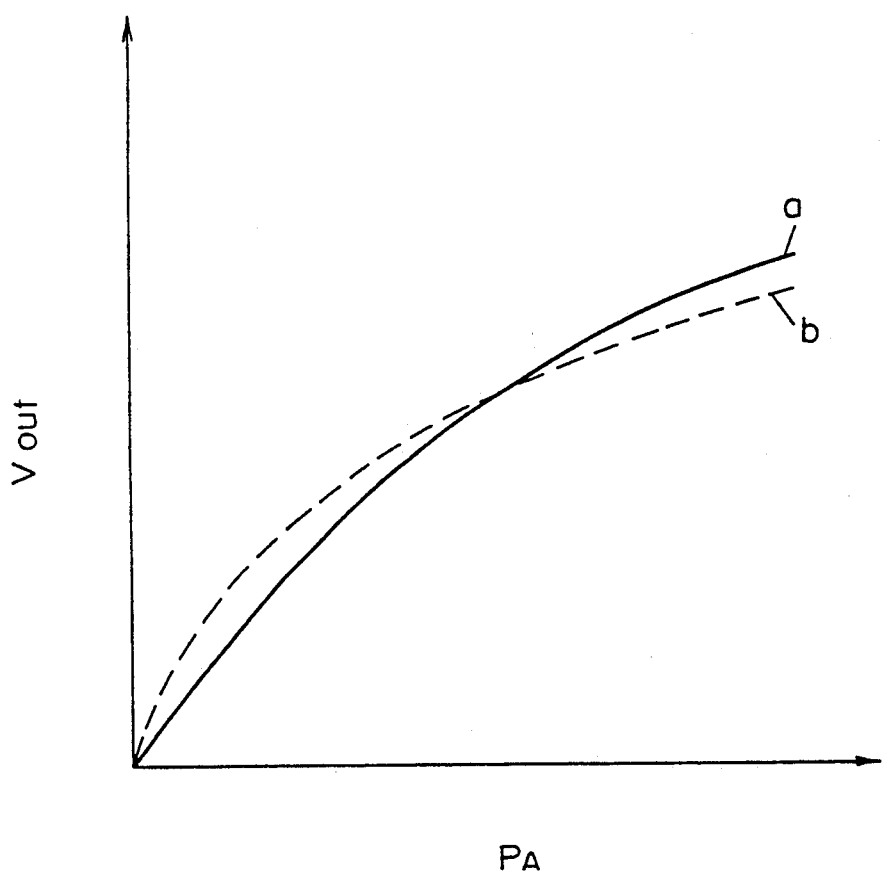
FIG. 10 is a graph showing the relation between input and output of the detection circuit based on temperature as a parameter.

FIG. 10 is a graph showing a characteristic curve for one example of temperature drift of input/output characteristics of the detection circuit. The abscissa indicates input $P_A$ of the detection circuit, i.e. quantity of microwaves detected by the antenna, while the ordinate indicates output $V_{out}$ of the detection circuit. Usually, in a detection circuit having the input/output characteristics a, when temperature of the circuit, i.e. temperature of the board itself rises, the curve a changes to the curve b. Namely, output increases to more than usual in a low input range but decreases to less than usual in a high input range, thereby resulting in a loss of sensitivity. If a measure for reduction of temperature drift by which a portion of air from the fan is directed towards the support 18 as in the present invention is not taken, detection results scatter, thus resulting in improper finished cooked state of the food.

INDUSTRIAL APPLICABILITY

As described above in detail, since the detection circuit is constituted by the double-sided board, the front face and the rear face can be separately used as the signalling face and the grounding face, respectively. Thus, any external electromagnetic field can be intercepted by the grounding face, so that the detection signal can be stabilized and thus, highly reliable detection can be performed.

Meanwhile, since the antenna is formed by the copper foil on the printed board, dimensional accuracy of the antenna is excellent, detection accuracy of microwaves is also improved and wave data indicative of the state of the food in the heating chamber can be detected accurately.

Furthermore, since the antenna and the detection circuit are formed on the same board, accuracy in matching between the antenna and the detection circuit is excellent. Moreover, a transmission line connecting the antenna and the detection circuit can be made short and transmission loss characteristic of high frequency transmissions can be reduced. In addition, since a board used exclusively for the antenna is unnecessary, the production cost can be lowered and the size can be made compact.

Further, since the antenna and the detection circuit are on the opposite faces of the identical board, waves leaking outwardly from the periphery of the antenna can be restricted by the grounding face of the detection circuit and thus, noises detrimental to operation of external apparatuses can be reduced. Since the antenna can be formed by using a portion of the rear face of the detection circuit, the size can be made very compact. Furthermore, since the detection circuit is disposed on one face of the board opposite to that of the antenna, when microwaves are detected by the antenna, the elements of the detection circuit such as a diode, etc. are not likely to receive radiant heat, thus resulting in stable detection.

In addition, since the periphery of the antenna is enclosed by the grounding face, microwaves leaking outwardly from the vicinity of the antenna can be intercepted most efficiently and thus, production of noises affecting operation of external apparatuses can be restricted. On the contrary, the antenna is very unlikely to receive external noises and thus, stable detection can be carried out. Furthermore, since the matching can be changed by the width of a gap between the antenna and the grounding face, sensitivity can be changed freely. If the width of the gap is set in accordance with a permissible input range of the detection circuit, a desired circuit input can be obtained easily.

Meanwhile, since a grounding face does not exist on the rear face of the antenna, a transmission line such as a line of 50 $\Omega$ is not required to be provided between the antenna and the detection circuit, in contrast with general microstrip antennas, so that integral forming of the antenna and the detection circuit is facilitated. Meanwhile, it becomes unnecessary to form the antenna and the detection circuit on the same face of the board.

Additionally, since the antenna and the detection circuit are connected to each other by the through-hole, connection accuracy is excellent and detection accuracy is improved.

Since the antenna is formed at the central portion of the board and is fixed, through the peripheral grounding face, to the heating chamber by the mounting jig, a large length antenna can be provided relative to size of the board, so that the quantity of sensed waves is increased. Thus, even if there are scatters in mounting accuracy more or less, influence of the scatters can be lessened relatively. In other words, since size of the board may be made small for the antenna of a given length, an expensive board for high frequency microwaves can be made compact, thereby resulting in great reduction of the production cost. Since the antenna is fixed in position by using the peripheral portion of the board, necessary mounting accuracy of the antenna can be obtained easily.

Further, since the antenna and the detection circuit are mounted through the metal welded to the wall of the heating chamber, the grounding face can be positively short-circuited by the molded portions, mounting accuracy is excellent and impedance including the antenna and the detection circuit as observed from the heating chamber is stabilized. Furthermore, error factors in the quantity of detected microwaves can be eliminated. Therefore, highly reliable detection can be performed. For the same reason, since the detection circuit can be so held as to be spaced a short distance from the wall of the heating chamber, various cooling means can be employed easily, so that rise of temperature of the detection circuit can be restricted and thus, reliability in heat resistance is also improved greatly. Since the antenna is less likely to directly receive substances scattered from the food, corrosion of the antenna or change of detection sensitivity due to water or oil from the food does not take place.

Additionally, since the antenna and the detection circuit are fixed in position in the heating chamber by soldering the grounding face of the board to the metal plate, a short circuit point to ground can be secured and impedance including the antenna and the detection circuit as observed from the heating chamber is made constant. Thus, error factors in the quantity of microwaves detected by the antenna can be obviated, thereby resulting in highly reliable detection.

Furthermore, since the metal plate is fastened to the support on the wall of the heating chamber by the machine screws, mechanical stress at the time of positioning of the detection circuit can be absorbed by the metal plate, so that excessive load is not applied to the detection circuit. Therefore, failures such as cutoff of the transmission line due to cracking of the board, etc. do not happen and thus, reliability of detection is improved.

Moreover, since the detection circuit is covered by the metal cover, the influence of any external electromagnetic field is blocked and scatters of impedance due to variations of distance from outer metal parts are prevented, thereby resulting in stabilization of detection output.

Since the lead wire for delivering output of the detection circuit is fixed in position in the vicinity of its connecting portion with the detection circuit, scatters in the mounting position of the lead wire can be eliminated and an unstable factor that the lead wire carries or does not carry leakage current is obviated. In addition, since a phenomenon that the lead wire comes close to the antenna so as to change the state of matching between the antenna and the detection circuit or impedance obtained at the time when the antenna is observed from interior of the heating chamber does not take place, detection accuracy is quite excellent.

Since the coating is applied to the antenna, a short circuit between the antenna and the wall of the heating chamber or other potential faces due to water or oil generated from the food and corrosion of the antenna does not take place and thus, stable detection performance can be provided.

Since the ventilation openings are formed on the support for the printed board so as to pass therethrough a portion of air from the fan for cooling the wave irradiator, effect of heat dissipation is marked. Therefore, rise of temperature of the board can be restricted, so that detection performance of the detection circuit is stabilized and thus, detection accuracy is excellent and erroneous detection is avoided. Furthermore, since cool air passes through the ventilation openings at all times, steam (vapor) is not likely to be stored, so that formation of dew on the detection circuit is prevented and thus, a circuit further free from erroneous operation can be obtained.

We claim:

1. A high-frequency heating apparatus comprising:
   a heating chamber for accomodating a food;
   a wave irradiator for irradiating electromagnetic waves over the food so as to heat the food;
   an antenna positioned relative to said heating chamber for receiving a portion of the electromagnetic waves in the heating chamber other than those absorbed by the food;
   a detection circuit connected to said antenna for detecting the electromagnetic waves received by said antenna and producing an output indicative of the received electromagnetic waves;
   a controller connected to said detection circuit for controlling various operations of said apparatus in accordance with the output of said detection circuit; and
   a printed board, said antenna being formed by copper foil provided on said printed board, said printed board further having a grounding face of copper foil on the same face of said printed board as said antenna and surrounding and spaced from said antenna.

2. A high frequency heating apparatus as claimed in claim 1 wherein the copper foil of said antenna has a resist coating thereover.

3. A high frequency heating apparatus as claimed in claim 1 wherein said antenna is in the vicinity of the center of the printed board, and further comprising a metal support fixing said printed board to said heating chamber by mounting means extending through the grounding face surrounding the antenna.

4. A high frequency heating apparatus as claimed in claim 3 wherein said metal support is welded to a wall of the heating chamber.

5. A high frequency heating apparatus as claimed in claim 3 further comprising a metal plate, and said grounding face of said printed board is soldered to said metal plate, and said mounting means are machine screws fastening said metal plate to said metal support on the wall of the heating chamber.

6. A high-frequency heating apparatus as claimed in claim 1 in which said antenna and said detection circuit are both mounted on a single circuit board.

7. A high frequency heating apparatus as claimed in claim 6 wherein said board has faces on opposite sides thereof and said antenna and said detection circuit are provided on respective opposite faces.

8. A high frequency heating apparatus as claimed in claim 7 wherein said circuit board has a hole therethrough through which said antenna is connected to said detection circuit.

* * * * *

UNITED STATES PATENT AND TRADEMARK OFFICE
CERTIFICATE OF CORRECTION

PATENT NO. : 5,254,819
DATED : October 19, 1993
INVENTOR(S) : Koji Yoshino et al.

It is certified that error appears in the above-identified patent and that said Letters Patent is hereby corrected as shown below:

On the cover page, item [22] should read as follows:

--[22] PCT Filed: December 26, 1990--

Signed and Sealed this

Third Day of May, 1994

*Attest:*

BRUCE LEHMAN

*Attesting Officer*    *Commissioner of Patents and Trademarks*